(12) United States Patent
Ahmad et al.

(10) Patent No.: US 12,580,528 B2
(45) Date of Patent: Mar. 17, 2026

(54) TRANSCEIVER CIRCUIT AND ASSOCIATED INTERFERENCE MITIGATION METHOD

(71) Applicant: TEXAS INSTRUMENTS INCORPORATED, Dallas, TX (US)

(72) Inventors: Zeshan Ahmad, Plano, TX (US); Mayank Kumar Singh, Mountain View, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 397 days.

(21) Appl. No.: 18/157,556

(22) Filed: Jan. 20, 2023

(65) Prior Publication Data

US 2024/0250646 A1     Jul. 25, 2024

(51) Int. Cl.
| | |
|---|---|
| *H03F 3/08* | (2006.01) |
| *H03F 3/45* | (2006.01) |
| *H04B 1/16* | (2006.01) |

(52) U.S. Cl.
CPC ......... *H03F 3/087* (2013.01); *H03F 3/45475* (2013.01); *H04B 1/16* (2013.01)

(58) Field of Classification Search
CPC .... H03F 3/087; H03F 3/45475; H03F 1/0244; H03F 2200/129; H03F 2203/45114; H03F 2203/45288; H04B 1/16; G01S 7/021; G01S 7/352; G01S 7/36; G01S 7/023
See application file for complete search history.

(56) References Cited

U.S. PATENT DOCUMENTS

| | | | |
|---|---|---|---|
| 10,326,420 | B1 | 6/2019 | Bellaouar |
| 11,750,253 | B2 | 9/2023 | Wang |
| 2019/0250264 | A1 | 8/2019 | Belfiore |
| 2021/0258040 | A1* | 8/2021 | Musayev ................ H03F 3/189 |
| 2022/0137181 | A1 | 5/2022 | Santra et al. |
| 2022/0260700 | A1 | 8/2022 | Mohta |
| 2023/0128469 | A1 | 4/2023 | Garrity |
| 2024/0154585 | A1* | 5/2024 | Roeckner ................ H03F 3/265 |

FOREIGN PATENT DOCUMENTS

| | | |
|---|---|---|
| WO | WO 2020041875 A1 | 3/2020 |
| WO | WO 2021232030 A1 | 11/2021 |

OTHER PUBLICATIONS

PCT/US2024/012156_International_Search_Report, 3 pages.
ECEN620: Network Theory Broadband Circuit Design, Fall 2021, "Lecture 13: Transimpedance Amplifiers (TIAs)", Sam Palermo Analog & Mixed-Signal Center, Texas A&M University, 63 pgs.
Sahu, et al., "A 45nm 76-81GHz CMOS Radar Receiver for Automotive Applications", IEEE Asian Solid-State Circuits Conference, Nov. 4-6, 2019, The Parisian Macao, Macao SAR, China. 4 pgs.

* cited by examiner

*Primary Examiner* — Nader Bolourchi

(74) *Attorney, Agent, or Firm* — Michael T. Gabrik; Frank D. Cimino

(57) ABSTRACT

In an embodiment, a system includes: an analog-to-digital converter (ADC); a receiver path including a transimpedance amplifier having an output coupled to the ADC; and a controller coupled to the receiver path and configured to, upon detection of a jamming event of the receiver path, cause an increase in a transconductance of the transimpedance amplifier from a first transconductance value to a second transconductance value.

20 Claims, 14 Drawing Sheets

1200

1202f

1202l

1202r

1202b

1400

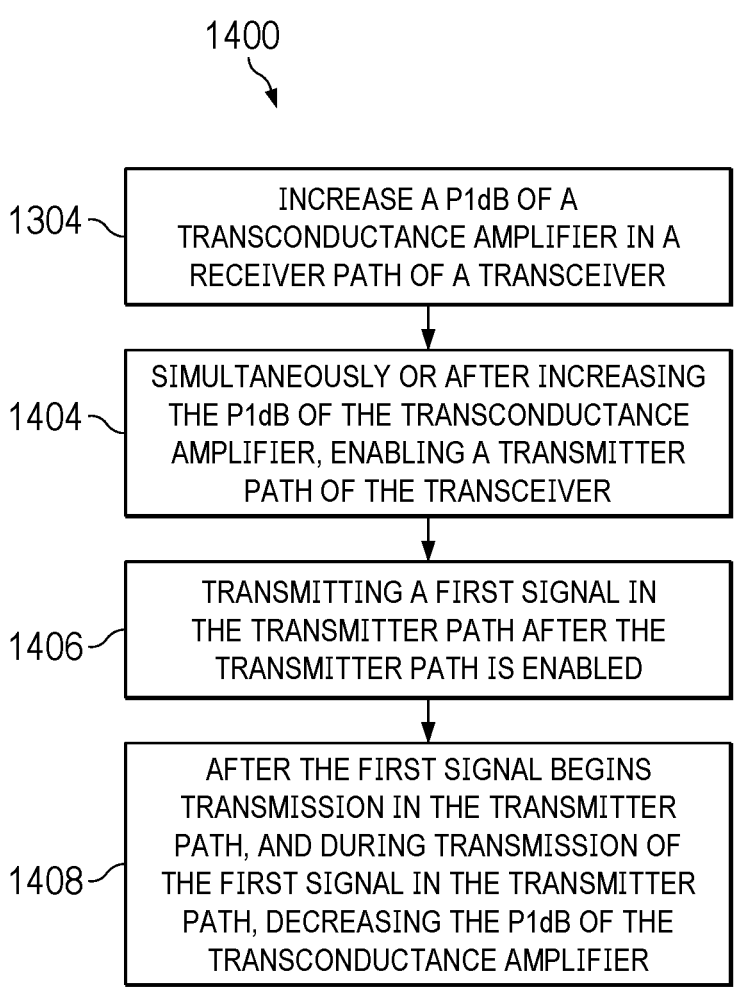

1304 — INCREASE A P1dB OF A TRANSCONDUCTANCE AMPLIFIER IN A RECEIVER PATH OF A TRANSCEIVER

1404 — SIMULTANEOUSLY OR AFTER INCREASING THE P1dB OF THE TRANSCONDUCTANCE AMPLIFIER, ENABLING A TRANSMITTER PATH OF THE TRANSCEIVER

1406 — TRANSMITTING A FIRST SIGNAL IN THE TRANSMITTER PATH AFTER THE TRANSMITTER PATH IS ENABLED

1408 — AFTER THE FIRST SIGNAL BEGINS TRANSMISSION IN THE TRANSMITTER PATH, AND DURING TRANSMISSION OF THE FIRST SIGNAL IN THE TRANSMITTER PATH, DECREASING THE P1dB OF THE TRANSCONDUCTANCE AMPLIFIER

FIG. 14

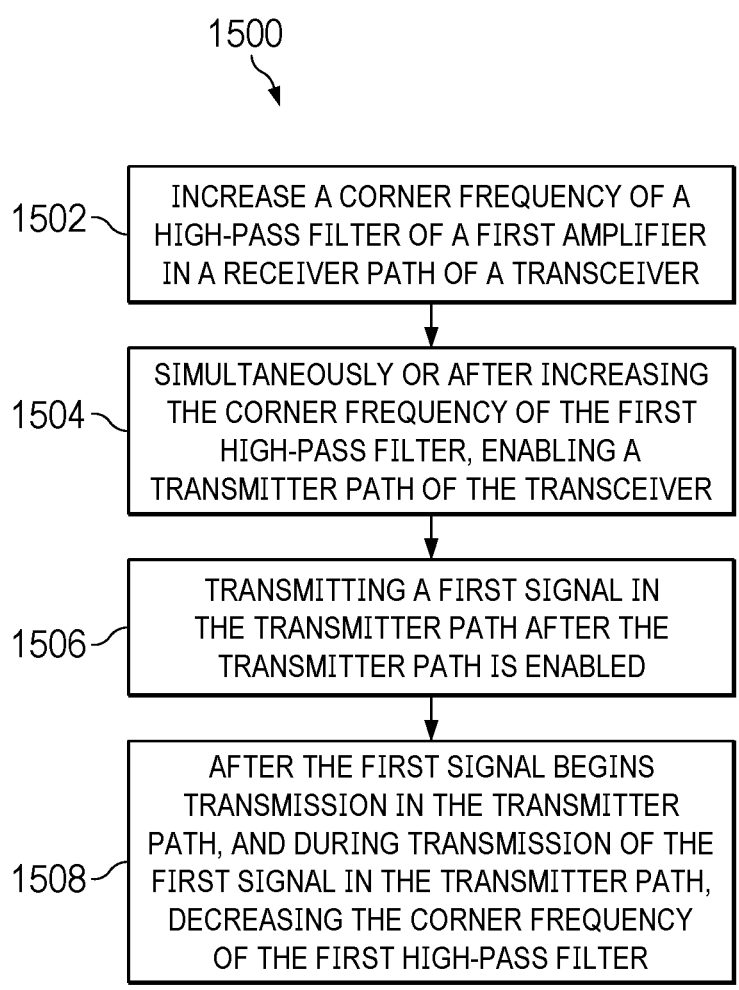

1500

1502 — INCREASE A CORNER FREQUENCY OF A HIGH-PASS FILTER OF A FIRST AMPLIFIER IN A RECEIVER PATH OF A TRANSCEIVER

1504 — SIMULTANEOUSLY OR AFTER INCREASING THE CORNER FREQUENCY OF THE FIRST HIGH-PASS FILTER, ENABLING A TRANSMITTER PATH OF THE TRANSCEIVER

1506 — TRANSMITTING A FIRST SIGNAL IN THE TRANSMITTER PATH AFTER THE TRANSMITTER PATH IS ENABLED

1508 — AFTER THE FIRST SIGNAL BEGINS TRANSMISSION IN THE TRANSMITTER PATH, AND DURING TRANSMISSION OF THE FIRST SIGNAL IN THE TRANSMITTER PATH, DECREASING THE CORNER FREQUENCY OF THE FIRST HIGH-PASS FILTER

FIG. 15

TRANSCEIVER CIRCUIT AND ASSOCIATED INTERFERENCE MITIGATION METHOD

CROSS-REFERENCE TO RELATED APPLICATIONS

This application is related to co-pending U.S. patent application Ser. No. 18/157,511, filed on the same day as this application, entitled "Transceiver Circuit and Associated Cross-Coupling Interference Mitigation Method," which application is hereby incorporated herein by reference.

TECHNICAL FIELD

The present disclosure relates generally to an electronic system and method, and, in particular embodiments, to a transceiver circuit and associated interference mitigation method.

BACKGROUND

FIG. 1 shows a schematic diagram of exemplary millimeter-wave radar system 100. During normal operation, frequency-modulated continuous wave (FMCW) synthesizer 114 generates transmitter signal $S_{TX}$, which includes chirps to be transmitted by power amplifier (PA) 108 via transmitting antenna 104. The chirps transmitted by transmitting antenna 104 are reflected by objects (e.g., 101) in the field-of-view of radar system 100, and are received by receiving antenna 102. The reflected chirps received by receiving antenna are amplified by low-noise amplifier (LNA) 106 to generate receiver signal $S_{RX}$. The transmitter signal $S_{TX}$ and receiver signal $S_{RX}$ are mixed by mixer 110 to generate intermediate frequency signal $S_{IF}$. Intermediate frequency signal $S_{IF}$ is amplified by amplifier 112 to generate output voltage $V_{out}$. Output voltage $V_{out}$ is digitized using analog-to-digital converter (ADC) 116 to generate raw radar digital data $D_{raw}$. Data $D_{raw}$ is then processed by radar processing system 118, e.g., to detect and track targets, classify targets, etc.

Generally, the time between chirps (also referred to as pulse repetition time, or PRT) dictates the ability of the system to unambiguously detect the maximum velocity of a target (shorter pulse repetition times result in a higher maximum velocity of the target for the target to be detected unambiguously following the relationship, $$\vartheta_{max} = \frac{c}{4 f_0 T_c},$$

where c is velocity of light, $f_0$ is carrier frequency of the system, and $T_c$ is the pulse repetition time). Therefore, for a given carrier frequency, shorter $T_c$ are generally highly desirable to meet the practical needs of sensors used in various automotive domains as part of the Advanced Driver Assist System (ADAS)—a precursor to self-driving cars and example applications include such as automatic emergency breaking (AEB), cruise control, cross-traffic alert (CTA), back-side detection (BSD) to avoid collisions and many more.

SUMMARY

In accordance with an embodiment, a system includes: an analog-to-digital converter (ADC); a receiver path including a transimpedance amplifier having an output coupled to the ADC; and a controller coupled to the receiver path and configured to, upon detection of a jamming event of the receiver path, cause an increase in a transconductance of the transimpedance amplifier from a first transconductance value to a second transconductance value.

In accordance with an embodiment, a system includes: an analog-to-digital converter (ADC); a transmitter path; a receiver path including a transimpedance amplifier having an output coupled to the ADC; and a controller coupled to the transmitter path and to the receiver path, where the controller is configured to: cause an increase in a transconductance of the transimpedance amplifier from a first transconductance value to a second transconductance value, simultaneously or after causing the transconductance of the transimpedance amplifier to increase, cause the transmitter path to be enabled, and after a first signal begins transmission in the enabled transmitter path, and during transmission of the first signal in the enabled transmitter path, cause the transconductance of the transimpedance amplifier to decrease from the second transconductance value to the first transconductance value.

BRIEF DESCRIPTION OF THE DRAWINGS

For a more complete understanding of the present invention, and the advantages thereof, reference is now made to the following descriptions taken in conjunction with the accompanying drawings, in which:

FIGS. 14 and 15 illustrate flow charts of embodiment methods for cross-coupling interference mitigation in a millimeter-wave radar system, according to embodiments of the present invention.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
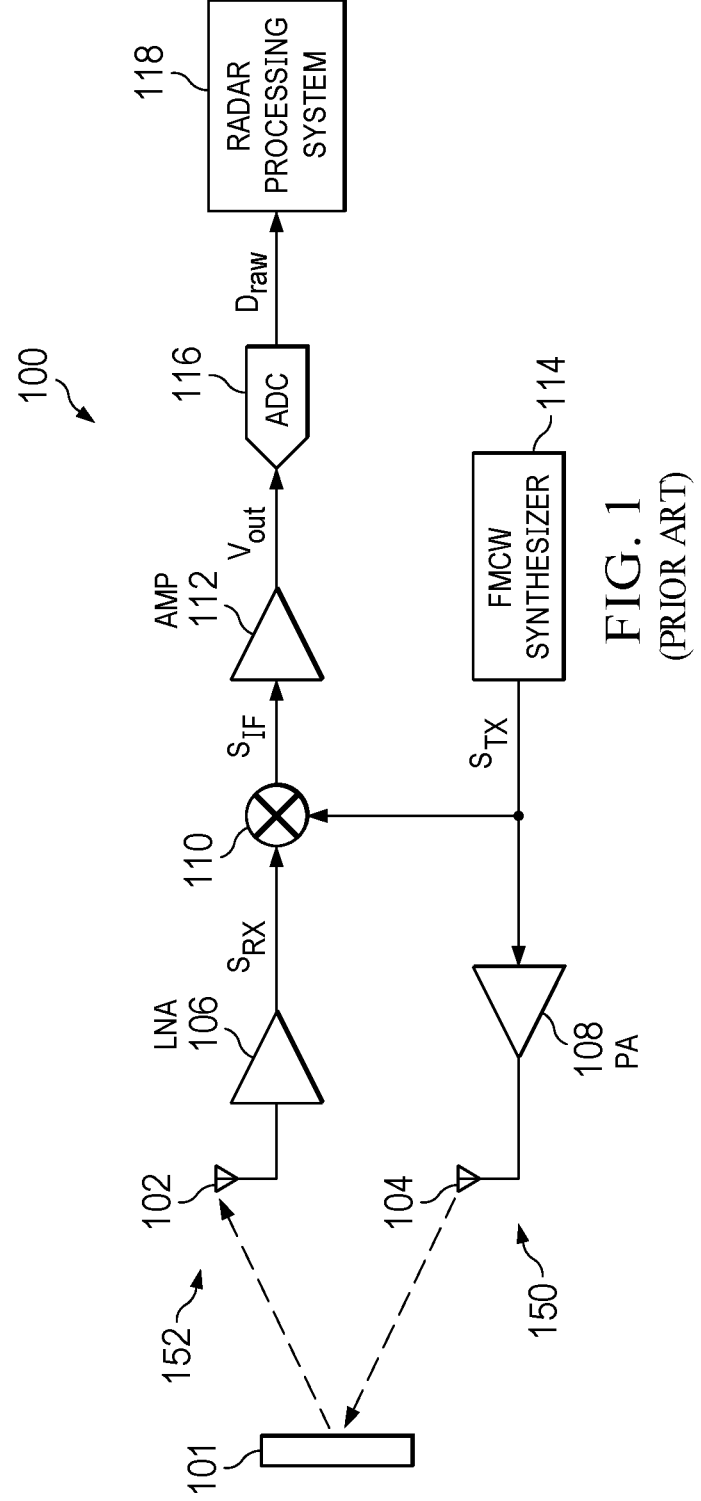
FIG. 1 shows a schematic diagram of an exemplary millimeter-wave radar system.

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Embodiments of the present invention will be described in specific contexts, e.g., an intermediate frequency (IF) or baseband (e.g., transimpedance) amplifier in a receiver path of a millimeter-wave radar, e.g., for automotive applications. Embodiments of the present invention may be used in other types of application, such as industrial and consumer applications. Some embodiments may be used in systems different from radar, such as wireless communication systems (e.g., Bluetooth, WiFi, 5G, etc.).

In an embodiment of the present invention, the 1 dB compression point (also referred to P1 dB) of an amplifier in a receiver path of a millimeter-wave radar system is temporarily increased, in a controlled manner and without any instabilities, when jamming is detected (which may be over a plurality of frames). Increasing the P1 dB of the amplifier in the presence of jamming may advantageously improve the ability of the millimeter-wave radar system to detect objects in the presence of jamming.

In some embodiments, the P1 dB of the amplifier is increased by increasing the transconductance $g_m$ of the amplifier, e.g., by increasing the bias current of the amplifier.

In some embodiments, the P1 dB of the amplifier is temporarily increased (alternatively or in addition to increasing the P1 dB of the amplifier in the presence of jamming), in a controlled manner and without any instabilities, during the beginning of each chirp to reduce the impact of self-coupling when a transmitter path of the millimeter-wave radar system is enabled. By temporarily increasing the P1 dB during the beginning of each chirp, some embodiments advantageously reduce the settling time of the IF amplifier, which may advantageously increase the usable operating bandwidth of the millimeter-wave radar system and may advantageously allow for reducing the pulse repetition time without a substantial impact in power consumption.

Figure 2:
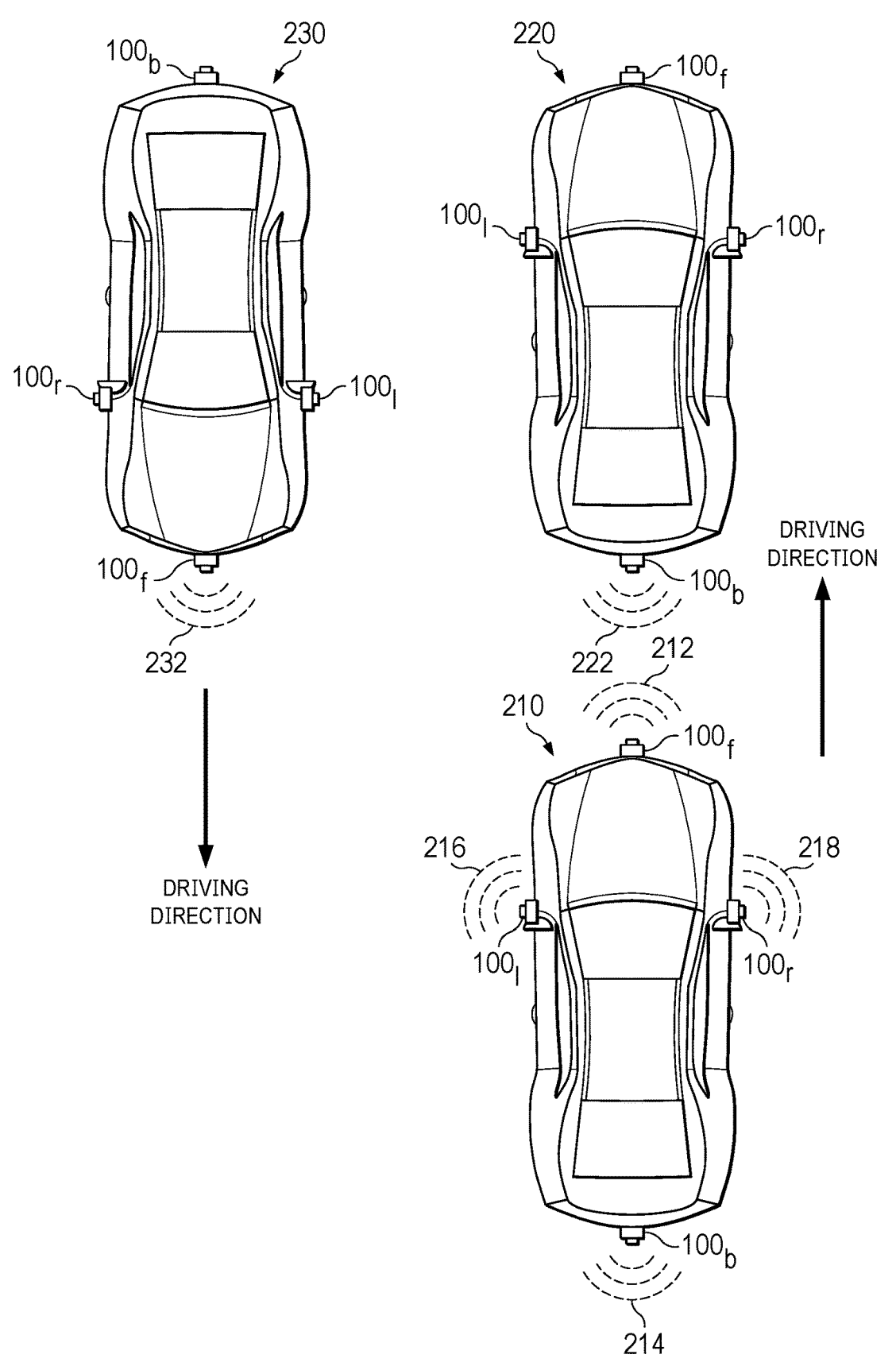
FIG. 2 illustrates a plurality of cars in a road, according to an embodiment of the present invention.

Automotive vehicles are increasingly including one or more millimeter-wave radars. With the increased number of radars in the road, the chances of radars jamming other radars increases. For example, FIG. 2 illustrates a plurality of cars (210, 220, 230) in a road, according to an embodiment of the present invention. Each car (210, 220, 230) includes a plurality of millimeter-wave radars 100. As shown, cars 210 and 220 are illustrated as moving in one direction and car 230 is illustrated as moving in the opposite direction.

As shown in FIG. 2, the radar signals 222 produced by radar 100*b* at the back of car 220 may temporarily cause jamming (e.g., cause saturation of the corresponding ADC 116) of radar 100*f* at the front of car 210 (e.g., while radar signals 222 received by the corresponding amplifier 112 via antenna 102 exceed the P1 dB of amplifier 112). Similarly, the radar signals 232 produced by radar 100*f* at the front of car 230 may cause jamming of radar 100*f* at the front of car 210 and radar 100*l* at the left part of car 210.

Figure 3:
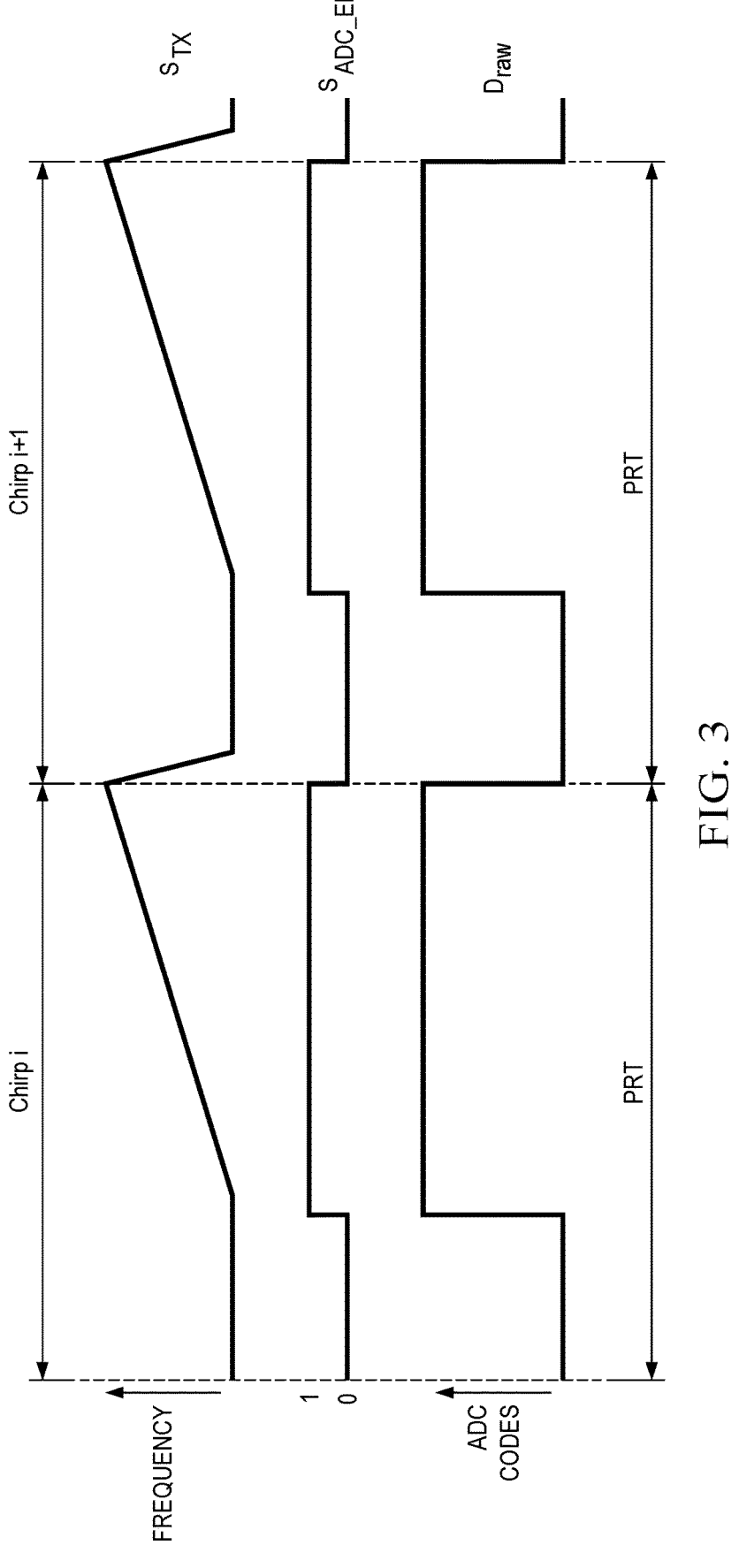
FIG. 3 illustrates exemplary behavior of the radar of FIG. 1 during a jamming event.

FIG. 3 illustrates exemplary behavior of radar 100*f* during a jamming event. As shown in FIG. 3, a jamming event, e.g., caused by another radar, may last a plurality of chirps. During the jamming event, when the ADC 116 is enabled (when $S_{ADC\_EN}=1$), the raw data $D_{raw}$ generated by ADC 116 is saturated (constantly high in this example). In some cases, the saturation of ADC 116 may manifest in other ways. For example, in some cases, the saturation of ADC 116 may occur only in specific frequencies (tones). In some cases, the jamming event may cause voltage $V_{out}$ to be saturated (e.g., either high or low). In some cases, the jamming event may cause the total energy of the system (across all bins) to increase beyond a predetermined threshold.

Although a jamming event may be caused by another radar, a jamming event may also be caused in other ways. For example, a jamming event may be caused due to an increase in self-coupling, e.g., due to deformation of the enclosure containing the radar, or due to additional coupling due to ice formation in the radar module.

In an embodiment of the present invention, the saturation of an ADC during a jamming event is mitigated by temporarily increasing the P1 dB of an amplifier having an output coupled to the ADC. By preventing or otherwise removing the saturation of the ADC during a jamming event, some embodiments are advantageously capable of performing target detection and other radar signal processing tasks (e.g., target tracking, classification, etc.) during a jamming event.

Figure 4:
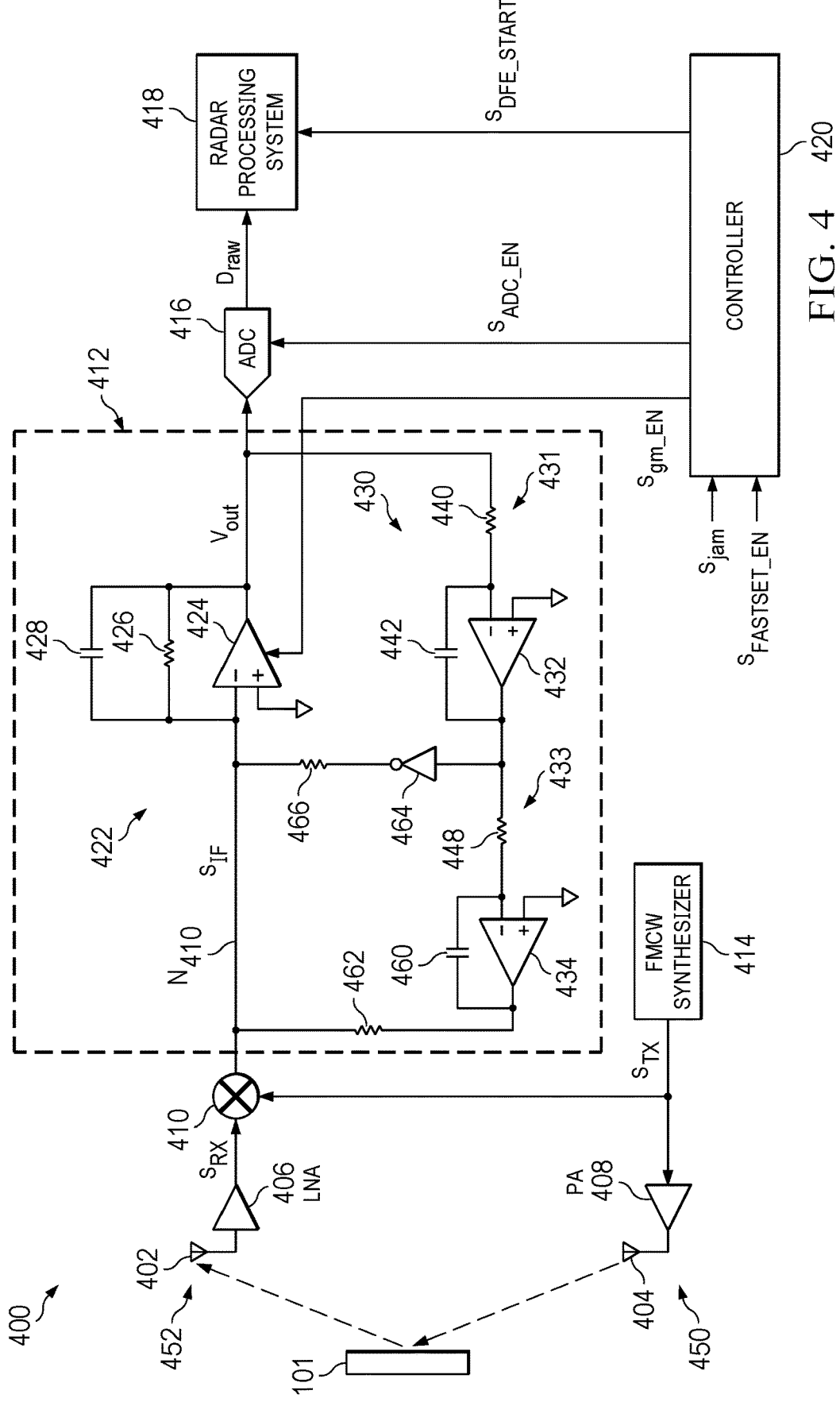
FIG. 4 shows a schematic diagram of a millimeter-wave radar system, according to an embodiment of the present invention.

FIG. 4 shows a schematic diagram of millimeter-wave radar system 400, according to an embodiment of the present invention. Millimeter-wave radar system 400 includes controller 420, transmitter path 450, receiver path 452, ADC 416, and radar processing system 418. Transmitter path 450 includes FMCW synthesizer 414 and power amplifier 408. Receiver path 452 includes LNA 406, mixer 410, and amplifier 412. Additional example details of an amplifier in a radar system can be found in commonly assigned U.S. patent application Ser. No. 17/566,047, entitled "Intermediate Frequency Amplifier with a Configurable High-Pass Filter," filed on Dec. 30, 2021, which is incorporated by reference in its entirety.

Figure 5:
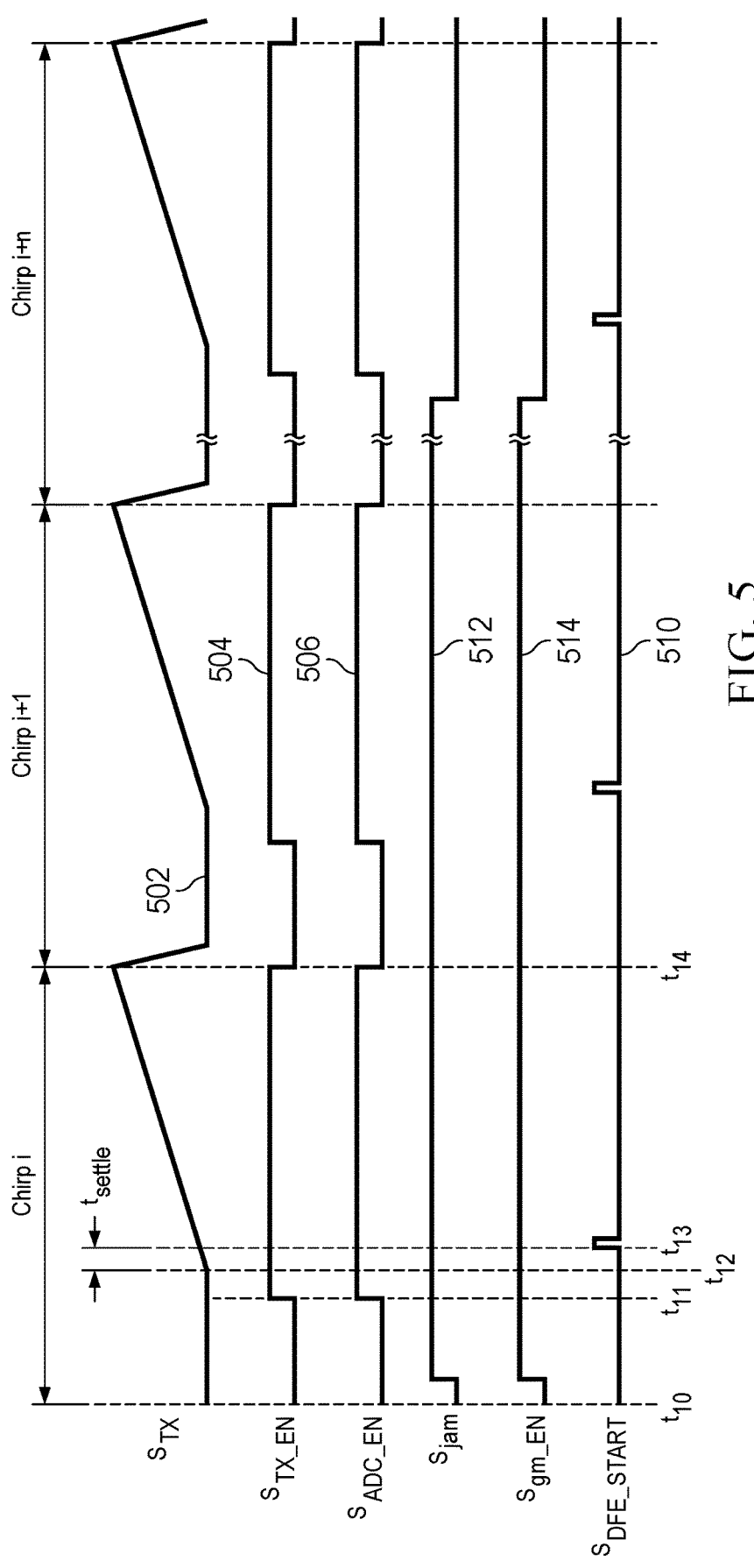
FIG. 5 illustrates waveforms associated with the radar system of FIG. 4, according to an embodiment of the present invention.

FIG. 5 illustrates waveforms associated with radar system 400, according to an embodiment of the present invention. Curve 502 illustrates the frequency of signal $S_{TX}$ over time. Curves 504, 506, 510, 512 and 514 illustrate the digital state of signals $S_{TX\_EN}$, $S_{ACD\_EN}$, $S_{DFE\_START}$, $S_{jam}$, and $S_{gm\_EN}$, respectively, over time. FIGS. 4 and 5 may be understood together.

During normal operation, FMCW synthesizer 414 generates transmitter signal $S_{TX}$, which includes (e.g., up) chirps, as shown by curve 502. The transmitter signal $S_{TX}$ is transmitted by power amplifier (PA) 408 via transmitting antenna 404 towards objects in the field of view of radar system 400. The chirps transmitted by transmitting antenna 404 are reflected by objects (e.g., 101) in the field-of-view of radar system 400, and are received by receiving antenna 402. The reflected chirps received by receiving antenna are amplified by low-noise amplifier (LNA) 406 to generate receiver signal $S_{RX}$. The transmitter signal $S_{TX}$ and receiver signal $S_{RX}$ are mixed by mixer 410 to generate intermediate frequency signal $S_{IF}$. Intermediate frequency signal $S_{IF}$ is amplified and filtered by amplifier 412 to generate output voltage $V_{out}$. Output voltage $V_{out}$ is digitized using analog-to-digital converter (ADC) 416 to generate raw radar digital data $D_{raw}$. Data $D_{raw}$ is then processed by radar processing system 418, e.g., to detect, track, identify, and/or classify targets.

As shown in FIG. 4, in some embodiments, amplifier 412 may be implemented with forward path 422 and feedback path 430. Forward path 422 includes gain transimpedance amplifier 424 (which may be implemented as a transimpedance amplifier). Feedback path 430 includes high-pass filters 431 and 433 (which in some embodiments form a second-order high-pass filter). As shown in FIG. 4, in some embodiments, output $V_{out}$ is fed back, high-pass filtered by high-pass filters 431 and 433, and subtracted from node $N_{410}$, which may remove high-frequency content from signal $S_{IF}$, thereby removing such high frequency content from signal $V_{out}$. For example, as shown in FIG. 4, the output signal from high-pass filter 431 is inverted by inverting unity gain buffer 464 and injected into node $N_{410}$, and is also inverted by high-pass filter 433 and injected into node $N_{410}$, thereby causing the outputs from inverting buffer 464 and amplifier 434 to be subtracted from node $N_{410}$.

As shown in FIG. 5, in some embodiments, the transmitter path 350 (e.g., circuit 408 or a portion thereof) may be enabled (e.g., by asserting signal $S_{TX\_EN}$, e.g., high) for chirp transmission and disabled (e.g., by deasserting signal $S_{TX\_EN}$, e.g., low) between chirps, which may advantageously reduce power consumption.

In some embodiments, upon re-enablement of the transmitter path 450 (when signal $S_{TX\_EN}$ is asserted) and transmission of a chirp, cross-coupling may occur between the transmitter path 450 and the receiver path 452 that may temporarily saturate the ADC 416. In some embodiments, the time that ADC 416 remains saturated depends on the corner frequency of high-pass filters 431 and 433. In some embodiments, once ADC 316 is no longer saturated, signal $S_{DFE\_START}$ is pulsed to mark the beginning of the useful (e.g., non-saturated) ADC samples of data $D_{raw}$.

As shown in FIG. 5, when a jamming event is detected, signal $S_{jam}$ is asserted (e.g., high). In some embodiments, the jamming detection and the assertion of signal $S_{jam}$ is performed by controller 420. In some embodiments, signal $S_{jam}$ is received from an external circuit.

In some embodiment's, jamming of millimeter-wave radar system 400 is detected by monitoring the output of ADC 416. For example, when a jamming event is detected, e.g., when the output $D_{raw}$ shows saturation during a time where saturation is not expected (e.g., between times $t_{13}$ and $t_{14}$), the signal $S_{jam}$ may be asserted. For example, in some embodiments in which ADC 416 is implemented without using a sigma-delta ADC (e.g., SAR, pipeline, etc.), jamming may be detected by detecting more than 1 consecutive ADC sample outside the normal operating window (e.g., stuck at max code or stuck at min code for 2 or more samples).

In some embodiments, jamming may be detected in other ways. For example, in some embodiments (independent of the topology of ADC 416), jamming may be detected by monitoring voltage $V_{out}$ (e.g., with a comparator, such as a window comparator, not shown in FIG. 4) and determining that a jamming event occurred when the voltage $V_{out}$ is higher than a predetermined maximum threshold or lower than a predetermined minimum threshold. For example, in some embodiments, the signal $S_{jam}$ may be generated by the output of such window comparator.

As another example, in some embodiments, a jamming event is detected when the total energy of the system (e.g., across all bins, e.g., based on an FFT of $D_{raw}$ performed by radar processing system 418) is higher than a predetermined threshold.

Upon detecting that the jamming event is over, signal $S_{jam}$ is deasserted (e.g., low). In some embodiments, detecting that the jamming event is over may be performed by radar processing system 418, when the total energy of the system (e.g., across all bins, e.g., based on an FFT of $D_{raw}$ performed by radar processing system 418) is lower than a predetermined threshold.

As shown in FIG. 5, signal $S_{jam}$ may be asserted for a plurality of chirps. For example, FIG. 5 shows that signal $S_{jam}$ is asserted for n+1 chirps, where n is a positive integer greater than or equal to 0.

As shown in FIG. 5, assertion of signal $S_{jam}$ causes the assertion (e.g., simultaneously or shortly thereafter) of signal $S_{gm\_EN}$. As shown in FIG. 4, signal $S_{gm\_EN}$ is provided to transimpedance amplifier 424. Upon assertion of signal $S_{gm\_EN}$, the transconductance gm of transimpedance amplifier is increased, which increases the P1 dB of transimpedance amplifier 424, thereby advantageously increasing the capability of transimpedance amplifier 424 to process signal $S_{IF}$ during a jamming event without causing saturation of transimpedance amplifier 424. In some embodiments, radar processing system 418 compensates for any change gain that may be caused by the change in the transconductance gm of amplifier 424.

FMCW synthesizer 414 is configured to generate transmitter signal $S_{TX}$ and provide such transmitter signal $S_{TX}$ to power amplifier 408. In some embodiments, the transmitter signal $S_{TX}$ include up-chirps. In some embodiments, the transmitter signal $S_{TX}$ include down-chirps. In some embodiments, FMCW synthesizer 414 may be implemented in any way known in the art.

In some embodiments, the chirps generated by FMCW synthesizer 414 may have a start and end frequency of 76 GHz and 81 GHZ, respectively. Other frequencies may also be used. For example, in some embodiments, the chirps generated by FMCW synthesizer 414 may have a start and end frequency of 57 GHz and 64 GHz, respectively.

In some embodiments, power amplifier 408 is configured to transmit radar signals (based on, such as by amplifying, signal $S_{TX}$) via transmitting antenna 404. In some embodiments, power amplifier 408 may be implemented in any way known in the art.

In some embodiments, LNA 406 is configured to receive reflected radar signals via receiving antenna 402, and provide an amplified (and, e.g., filtered) reflected signal $S_{RX}$ to mixer 410. In some embodiments, LNA 406 may be implemented in any way known in the art.

In some embodiments, mixer 410 is configured to mix signals $S_{TX}$ and $S_{RX}$ to produce intermediate frequency signal $S_{IF}$. In some embodiments, signal $S_{IF}$ is a current signal. In some embodiments, signal $S_{IF}$ is a voltage signal. In some embodiments, mixer 410 may be implemented in any way known in the art.

In some embodiments, ADC 416 is configured to receive voltage $V_{out}$ from amplifier 412, and provide digital code(s) based on the voltage $V_{out}$. In some embodiments, ADC 416 may be enabled when signal $S_{ADC\_EN}$ is asserted (e.g., high) and disabled when signal $S_{ADC\_EN}$ is deasserted (e.g., low). In some embodiments, ADC 416 may be implemented in any way known in the art.

In some embodiments, radar processing system 418 is configured to process digital data $D_{raw}$, e.g., to detect, identify, track, and/or classify targets. In some embodiments, radar processing system 418 may process data $D_{raw}$ based on signal $S_{DFE\_START}$. For example, in some embodiments, for each chirp, data $D_{raw}$ received after signal $S_{DFE\_START}$ is asserted (e.g., pulsed) may be processed while data received before signal $S_{DFE\_START}$ is asserted may be corrupted (e.g., saturated) and may be ignored. For example, in some embodiments, data $D_{raw}$ generated by ADC 416 and/or received by radar processing system 418 before signal $S_{DFE\_START}$ is asserted is discarded.

In some embodiments, radar processing system 418 may include a generic or custom controller or processor coupled to a memory and configured to execute instructions stored in such memory. Other implementations are also possible.

In some embodiments, controller 420 is configured to control or provide input(s) to circuits of millimeter-wave radar system 400, such as circuits 408, 414, 412, 416, and 418. For example, controller 420 may be configured to assert and deassert the signals $S_{gm\_EN}$, $S_{ADC\_EN}$, and/or $S_{DFE\_START}$. The controller 420 can deliver these signals to the circuits 412, 416, and 418 as shown in FIG. 4. Through control of one or more of these signals, controller 420 may be configured to enable and/or disable circuits 412, 416, and/or 418. In some embodiments, controller 420 may include a generic or custom controller or processor coupled to a memory and configured to execute instructions stored in such memory. In some embodiments, controller 420 may include a finite state machine. Other implementations are also possible.

This disclosure has attributed functionality to radar system 400 and controller 420. Radar system 400 and Controller 420 may include processing circuitry such as one or more processors. Radar system 400 and Controller 420 may include any combination of integrated circuitry, discrete logic circuitry, analog circuitry, such as one or more microprocessors, microcontrollers, digital signal processors, application specific integrated circuits, central processing units, graphics processing units, field-programmable gate arrays, and/or any other processing resources. In some examples, radar system 400 and controller 420 may include multiple components, such as any combination of the processing resources listed above, as well as other discrete or integrated logic circuitry, and/or analog circuitry.

The techniques described in this disclosure may also be embodied or encoded in an article of manufacture including a non-transitory computer-readable storage medium. Example non-transitory computer-readable storage media may include random access memory (RAM), read-only memory (ROM), programmable ROM, erasable programmable ROM, electronically erasable programmable ROM, flash memory, a solid-state drive, a hard disk, magnetic media, optical media, or any other computer readable storage devices or tangible computer readable media. The term "non-transitory" may indicate that the storage medium is not embodied in a carrier wave or a propagated signal. In certain examples, a non-transitory storage medium may store data that can, over time, change (e.g., in RAM or cache).

In some embodiments, IF amplifier 412 is configured to amplify and filter signal $S_{IF}$ to generate output voltage $V_{out}$. As shown, in some embodiments, IF amplifier 412 includes forward path 422 and feedback path 430.

In some embodiments, forward path 422 includes amplifier 424, resistor 426 and capacitor 428. In some embodiments, amplifier 424, resistor 426 and capacitor 428 form a low-pass filter (with a corner frequency higher than the corner frequency of high-pass filters 431 and 433). In some embodiments, amplifier 426 has a gain with a magnitude higher than 1.

In some embodiments, feedback path 430 includes high-pass filters 431 and 433. High-pass filter 431 includes amplifier 432, capacitor 442, and resistor 440. High-pass filter 433 includes amplifier 434, capacitor 460, and resistor 448.

As shown in FIG. 4, in some embodiments, amplifiers 424, 432 and 434 may be implemented as single-ended amplifiers. In some embodiments, amplifiers 424, 432, and 434 may be implemented as differential amplifiers.

In some embodiments, buffer 464 is configured to invert and buffer, with unity gain, the signal from the output of amplifier 432 into resistor 466. In some embodiments, the gain of buffer 464 may be different from 1. In some embodiments, buffer 464 may be implemented in any way known in the art.

In some embodiments in which signal $S_{IF}$ is a current, amplifier 424 may be implemented as a transimpedance amplifier (TIA). For example, in some embodiments in which signal $S_{IF}$ is a current (e.g., labeled as $I_{IF}$), amplifier 424 is implemented as a transimpedance amplifier that generates output voltage $V_{out}$ proportional to the current $I_{IF}$ (e.g., with a gain having a magnitude higher than 1).

Signal $S_{jam}$ is indicative of a jamming event being detected on millimeter-wave radar 400. In some embodiments, signal $S_{jam}$ is generated by controller 420 or external to radar 400. In some embodiments, signal $S_{jam}$ is generated based on the output of ADC 416 (e.g., upon detection of saturation at a time in which saturation is not expected).

Signal $S_{gm\_EN}$ is configured to cause, when asserted (e.g., high) an increase in the transconductance of transimpedance amplifier 424. In some embodiments, signal $S_{gm\_EN}$ is asserted in response to the assertion of signal $S_{jam}$ and deasserted in response to the deassertion of signal $S_{jam}$. In some embodiments, signal $S_{gm\_EN}$ is the same as signal $S_{jam}$ (e.g., signal $S_{jam}$ may be provided directly to amplifier 424).

Figure 6:
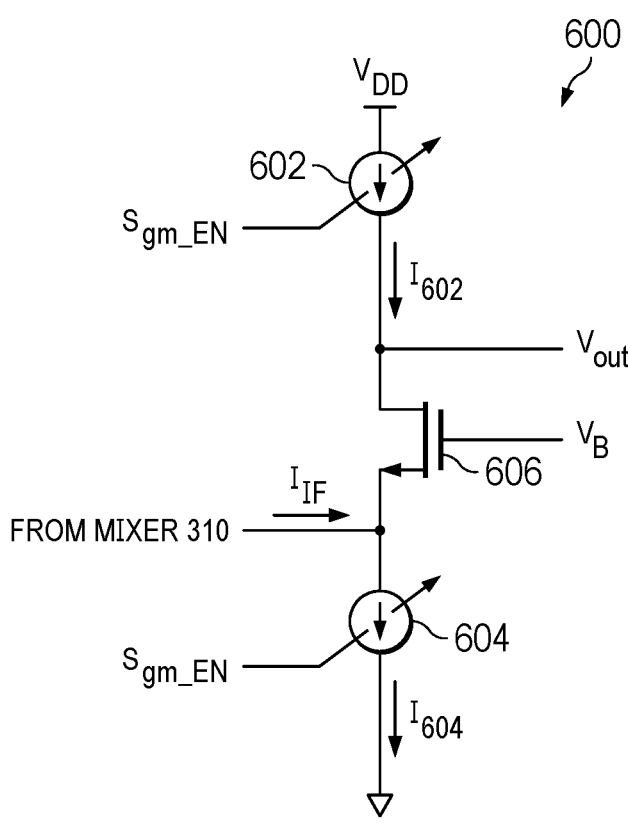
FIG. 6 shows a schematic diagram of the transimpedance amplifier of FIG. 4, according to an embodiment of the present invention.

FIG. 6 shows a schematic diagram of transimpedance amplifier 600, according to an embodiment of the present invention. In some embodiments implementing signal $S_{IF}$ with a current, amplifier 424 may be implemented as transimpedance amplifier 600.

During normal operation, transistor 606 is biased with bias voltage $V_B$, and voltage $V_{out}$ is proportional to current $I_{IF}$, where the transconductance $g_m$ of transimpedance amplifier 600 is based on the currents $I_{602}$ and $I_{604}$ generated by current sources 602 and 604, respectively. For example, higher currents $I_{602}$ and $I_{604}$ result in a higher transconductance gm of transimpedance amplifier 600.

As shown in FIG. 6, variable current sources 602 and 604 are controllable with signal $S_{gm\_EN}$. In some embodiments, assertion of signal $S_{gm\_EN}$ causes current 602 to increase from a first current to a second current, and causes current $I_{604}$ to increase from a third current to a fourth current. In some embodiments, deassertion of signal $S_{gm\_EN}$ causes current $I_{602}$ to decrease from the second current to the first current, and causes current $I_{604}$ to decrease from the fourth current to the third current.

In some embodiments, variable current sources 602 and 604 may be implemented in any way known in the art.

As shown in FIG. 6, in some embodiments, transimpedance amplifier 600 may be single-ended. In some embodiments, transimpedance amplifier 600 may be implemented as a differential amplifier (e.g., by replacing, in a known manner, the single-ended input with a differential input, and the single-ended output with a differential output).

Figure 7:
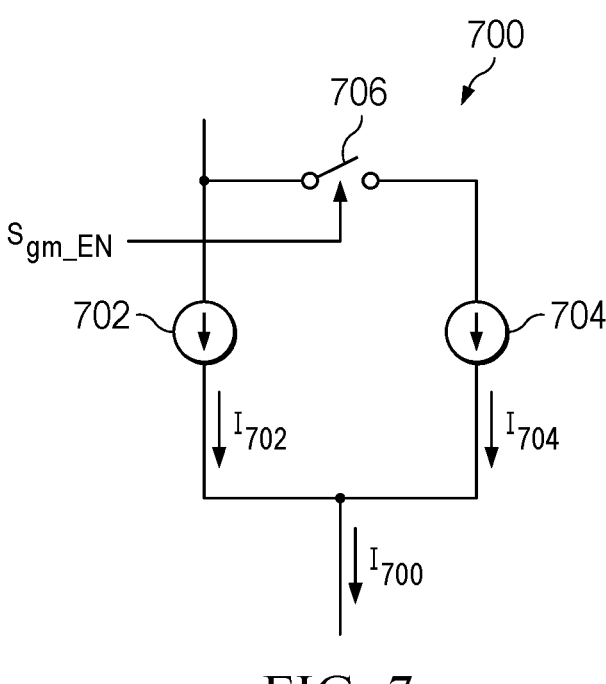
FIG. 7 shows a schematic diagram of a variable current source, according to an embodiment of the present invention.

FIG. 7 shows a schematic diagram of a variable current source, according to an embodiment of the present invention. In some embodiments, variable current source 602 and/or 604 may be implemented as variable current source 700.

During normal operation, when signal $S_{gm\_EN}$ is deasserted (e.g., low), switch 706 is open (e.g., deactivated), current $I_{704}$ is zero, and the current $I_{700}$ generated by current source 700 is equal to the current $I_{702}$ generated by current source 702. When signal $S_{gm\_EN}$ is asserted (e.g., high), switch 706 is closed (e.g., activated), and current $I_{700}$ is equal to $I_{702}+I_{704}$.

Figure 8:
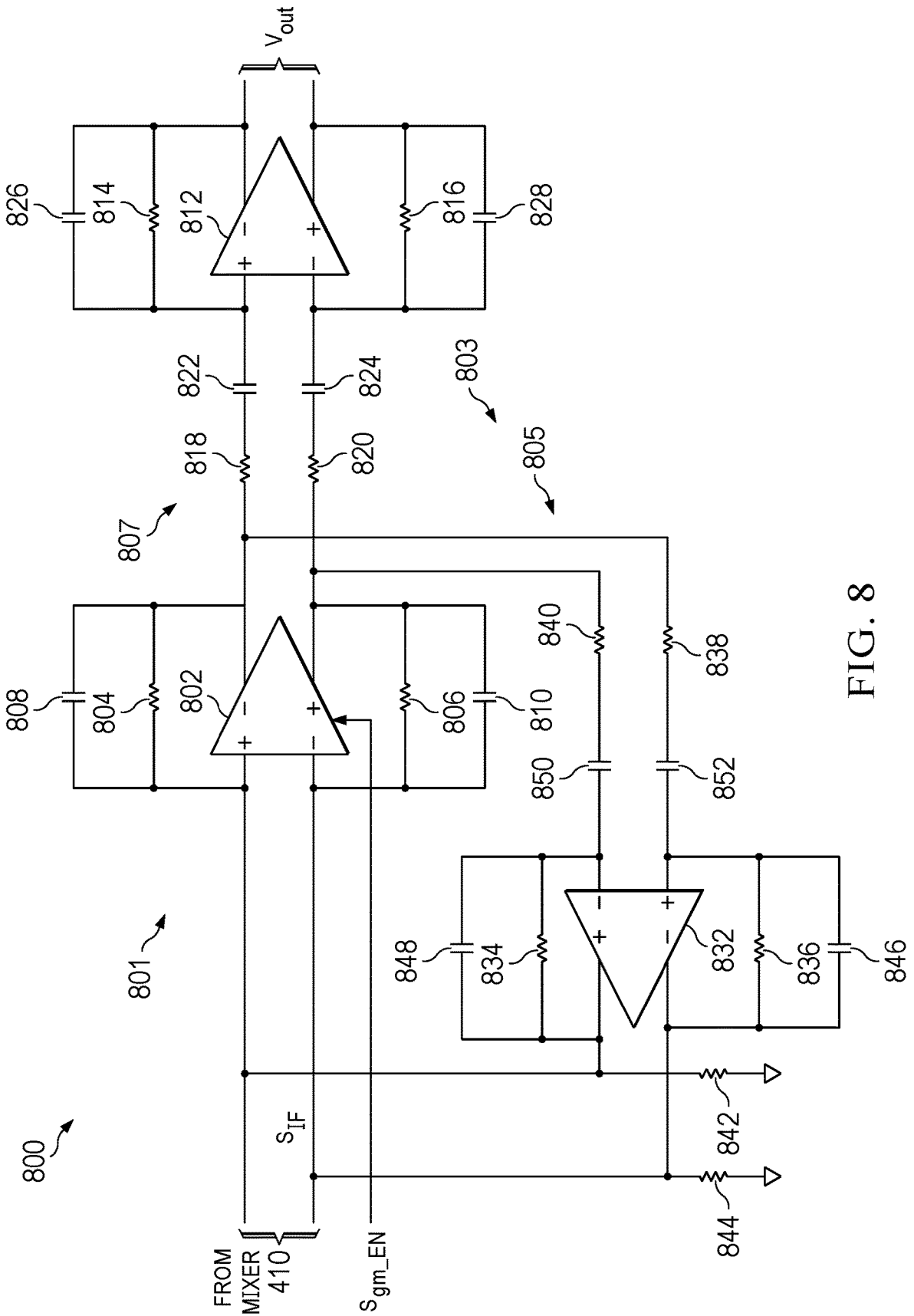
FIG. 8 shows a schematic diagram of an amplifier, according to an embodiment of the present invention.

As shown in FIG. 4, in some embodiments, the high-frequency filters (e.g., 431, 433) are implemented as part of the feedback path 430. In some embodiments, one or more high-pass filters may be implemented in the forward path instead of the feedback path. For example, FIG. 8 shows a schematic diagram of amplifier 800, according to an embodiment of the present invention. In some embodiments, amplifier 412 may be implemented as amplifier 800.

In some embodiments, amplifier 800 operates in a similar manner as amplifier 412 and the waveforms illustrated in FIG. 5 may be associated with amplifier 800. Amplifier 800, however, includes high-pass filter 807 as part of forward path 801 and high pass filter 805 as part of the feedback path 803.

As shown in FIG. 8, amplifiers 802, 812 and 832 are differential amplifiers. As also shown in FIG. 8, differential amplifier 802 receives signal $S_{gm\_EN}$ and increases the gm of amplifier 802 when signal $S_{gm\_EN}$ is asserted (e.g., by increasing the bias currents, e.g., in a similar manner as illustrated in FIGS. 6 and 7).

In some embodiments, amplifiers 802, 812 and 832 may be implemented as single-ended amplifiers.

Advantages of some embodiments include the ability to successfully perform target detection and other radar signal processing tasks (e.g., target tracking, classification, etc.) during a jamming event.

As described above, some embodiments may be implemented in millimeter-wave radar systems (e.g., 400). Some embodiments may be implemented in other types of systems, such as wireless communication systems such as Bluetooth and WiFi systems. For example, in some embodiments, a receiver of a wireless communication device may be jammed by the presence of strong signals (e.g., emanated by other nearby devices) in the same frequency band. During such jamming events, signal $S_{gm\_EN}$ may be asserted to increase the P1 dB of the gain transconductance amplifier (e.g., 424, 802) in the receiver path of the communication device to eliminate the saturation of the ADC and allow for processing of the received signals during the jamming event.

As shown in FIGS. 4 and 5, power amplifier 408 may be periodically turned off (e.g., after each chirp) by controlling signal $S_{TX\_EN}$, e.g., to save power and, e.g., to avoid thermal reliability due to self-heating. Each time power amplifier 408 is enabled (e.g., at the beginning of each chirp), cross-coupling between transmitter path 450 (which includes the transmission path from the output of FMCW synthesizer 414 to antenna 404) and receiver path 452 (which includes the transmission path from antenna 402 to the input of mixer 410) may cause signal $S_{IF}$ to exhibit strong (high amplitude) values at the low-frequency spectrum which may saturate the ADC 416 for a period of time $t_{settle}$. Thus, data $D_{raw}$ produced by ADC 416 during the period of time $t_{settle}$ may not be useful. Useful samples of data $D_{raw}$ (e.g., between times $t_{13}$ and $t_{14}$ of each chirp) may be further processed by radar processing system 418.

In an embodiment of the present invention, the saturation time of an ADC during the beginning of each chirp resulting from cross-coupling when a transmitter path is enabled is reduced by temporarily increasing the P1 dB of an amplifier (e.g., 424, 802) having an output coupled to the ADC. By reducing the saturation time of the ADC, some embodiments are advantageously capable of reducing the pulse repetition time (e.g., the time between $t_{10}$ and $t_{14}$ in FIG. 5), and advantageously increase the number of usable samples per chirp (and thus, increase the effective bandwidth of the millimeter-wave radar system).

Figures 9, 10:
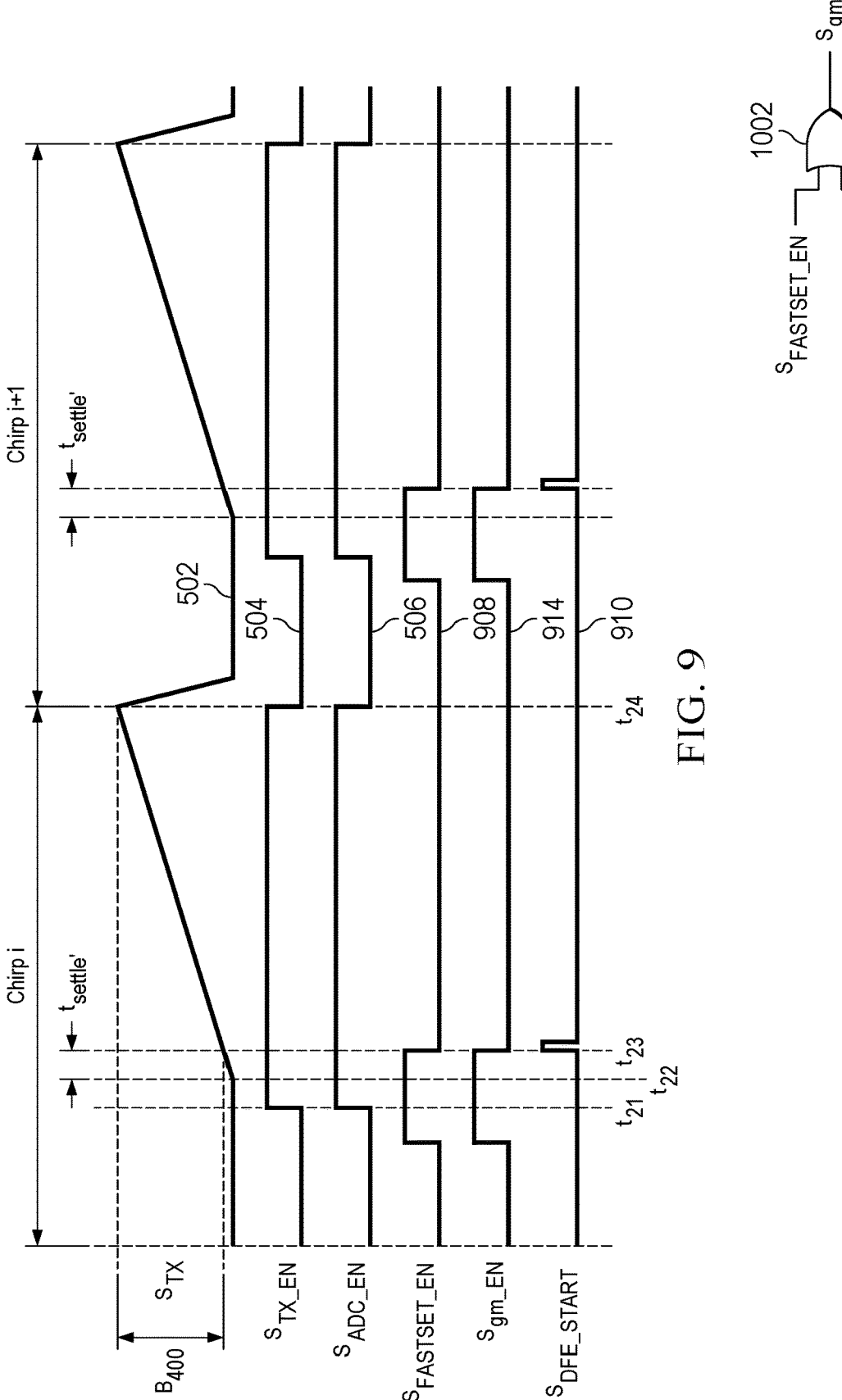
FIG. 9 illustrates waveforms associated with the radar system of FIG. 4, according to an embodiment of the present invention.
FIG. 10 shows a schematic diagram of a circuit for generating a transconductance control signal, according to an embodiment of the present invention.

FIG. 9 illustrates waveforms associated with radar system 400, according to an embodiment of the present invention. Curve 502 illustrates the frequency of signal $S_{TX}$ over time. Curves 504, 506, 910, 908 and 914 illustrate the digital state of signals $S_{TX\_EN}$, $S_{ACD\_EN}$, $S_{DFE\_START}$, $S_{FASTSET\_EN}$, and $S_{gm\_EN}$, respectively, over time. FIGS. 4 and 9 may be understood together.

As illustrated in FIG. 9, in some embodiments, signal $S_{gm\_EN}$ may be generated based on signal $S_{FASTSET\_EN}$ instead of based on signal $S_{jam}$.

As illustrated in FIG. 9, in some embodiments, the transmitter path 450 (e.g., circuit 408 or a portion thereof) may be enabled (e.g., by asserting signal $S_{TX\_EN}$, e.g., high) for chirp transmission and disabled (e.g., by deasserting signal $S_{TX\_EN}$, e.g., low) between chirps, which may advantageously reduce power consumption. Upon re-enablement of the transmitter path 450 (when signal $S_{TX\_EN}$ is asserted) and transmission of a chirp, cross-coupling may occur between the transmitter path 450 and the receiver path 452 that may temporarily saturate the ADC 416. In some embodiments, the time that ADC 416 remains saturated depends on the P1 dB of amplifier 424, and may be reduced by temporarily increasing the P1 dB of amplifier 424.

In some embodiments, the P1 dB of amplifier 424 is increased (by asserting signal $S_{FASTSET\_EN}$) on or before the beginning of each chirp to reduce the time that ADC 416 remains saturated upon re-enablement of transmitter path 450. Once ADC 416 is no longer saturated, the P1 dB of amplifier 424 is reduced to the original value (by deasserting signal $S_{FASTSET\_EN}$ at time $t_{23}$) for the reminder of the chirp.

$$d_{res} = \frac{c}{2B} cB$$

In some embodiments, advantageously exhibit a larger bandwidth $B_{400}$, since the time between time $t_{13}$ and $t_{14}$ is longer when compared with a longer settling time. A larger bandwidth $B_{400}$ may advantageously result in better range resolution, e.g., following the relationship $$d_{res} = \frac{c}{2B} cB,$$

where $d_{res}$ represents the range resolution, represents the speed of light, and represents the chirp bandwidth.

By only increasing the P1 dB of amplifier 424 during the beginning of the chirp, some embodiments advantageously achieve a faster settling time without significantly impacting power consumption (since the amount of time the P1 dB of amplifier 424 is increased is relatively small).

In some embodiments, signal $S_{FASTSET\_EN}$, when asserted, causes an increase in P1 dB of amplifier 424 from a first value to a second value; and, when deasserted, causes a decrease in P1 dB of amplifier 424 from the second value to the first value.

In some embodiments, the duration of the $S_{FASTSET\_EN}$ pulse (e.g., the duration in which $S_{FASTSET\_EN}$ pulse is asserted, e.g., high), and the start time of the $S_{FASTSET\_EN}$ pulse are programmable.

In some embodiments, signal $S_{FASTSET\_EN}$ is generated by controller 420 to be simultaneous or before the assertion of signal $S_{TX\_EN}$.

In some embodiments, signal $S_{gm\_EN}$ is configured to cause, when asserted (e.g., high) an increase in the transconductance of transimpedance amplifier 424. In some embodiments, signal $S_{gm\_EN}$ is asserted in response to the assertion of signal $S_{FASTSET\_EN}$ and deasserted in response to the deassertion of signal $S_{FASTSET\_EN}$. In some embodiments, signal $S_{gm\_EN}$ is the same as signal $S_{FASTSET\_EN}$ (e.g., signal $S_{FASTSET\_EN}$ may be provided directly to amplifier 424).

Although reducing the settling time by increasing the P1 dB of amplifier 424 has been described with respect to radar 400, a similar approach may be implemented in radar 800 (e.g., by generating signal $S_{gm\_EN}$ based on signal $S_{FASTSET\_EN}$).

As shown in FIG. 9, signal $S_{gm\_EN}$ may be based on signal $S_{FASTSET\_EN}$ instead of signal $S_{jam}$. In some embodiments, signal $S_{gm\_EN}$ may be based on signal $S_{FASTSET\_EN}$ in addition to signal $S_{jam}$. For example, in some embodiments, in the absence of a jamming event (when $S_{jam}$ is low), signal $S_{gm\_EN}$ may be asserted periodically at the beginning of each chirp (as illustrated in FIG. 9) to reduce the settling time $t_{settle}$; and in the presence of a jamming event (when $S_{jam}$ is high), signal $S_{gm\_EN}$ may be maintained asserted (e.g., for a plurality of chirps, e.g., as illustrated in FIG. 5), to mitigate saturation during a jamming event. In some such embodiments, signal $S_{gm\_EN}$ may be generated with an OR gate (e.g., 1002) as shown in FIG. 10.

As described in co-pending U.S. patent application Ser. No. 18/157,511, the settling time $t_{settle}$ may also be reduced by increasing the high-pass corner frequency of high pass filters 433 and 431 in radar 400, and of high pass filters 805 and 807 in radar 800, in response to the assertion of signal $S_{FASTSET\_EN}$. In some embodiments, the assertion of signal $S_{FASTSET\_EN}$ Simultaneously causes the increase of the high-pass corner frequency of high pass filters (e.g., 433 and 431 for radar 400; and 805 and 807 for radar 800), e.g., in a manner described in co-pending U.S. patent application Ser. No. 18/157,511, and the increase of the P1 dB of the transimpedance amplifier (424 in radar 400; 802 in radar 800), which may advantageously reduce the settling time $t_{settle}$ further without substantially increasing the silicon area and power consumption, and while retaining the ability to detect close-in objects.

Figure 11:
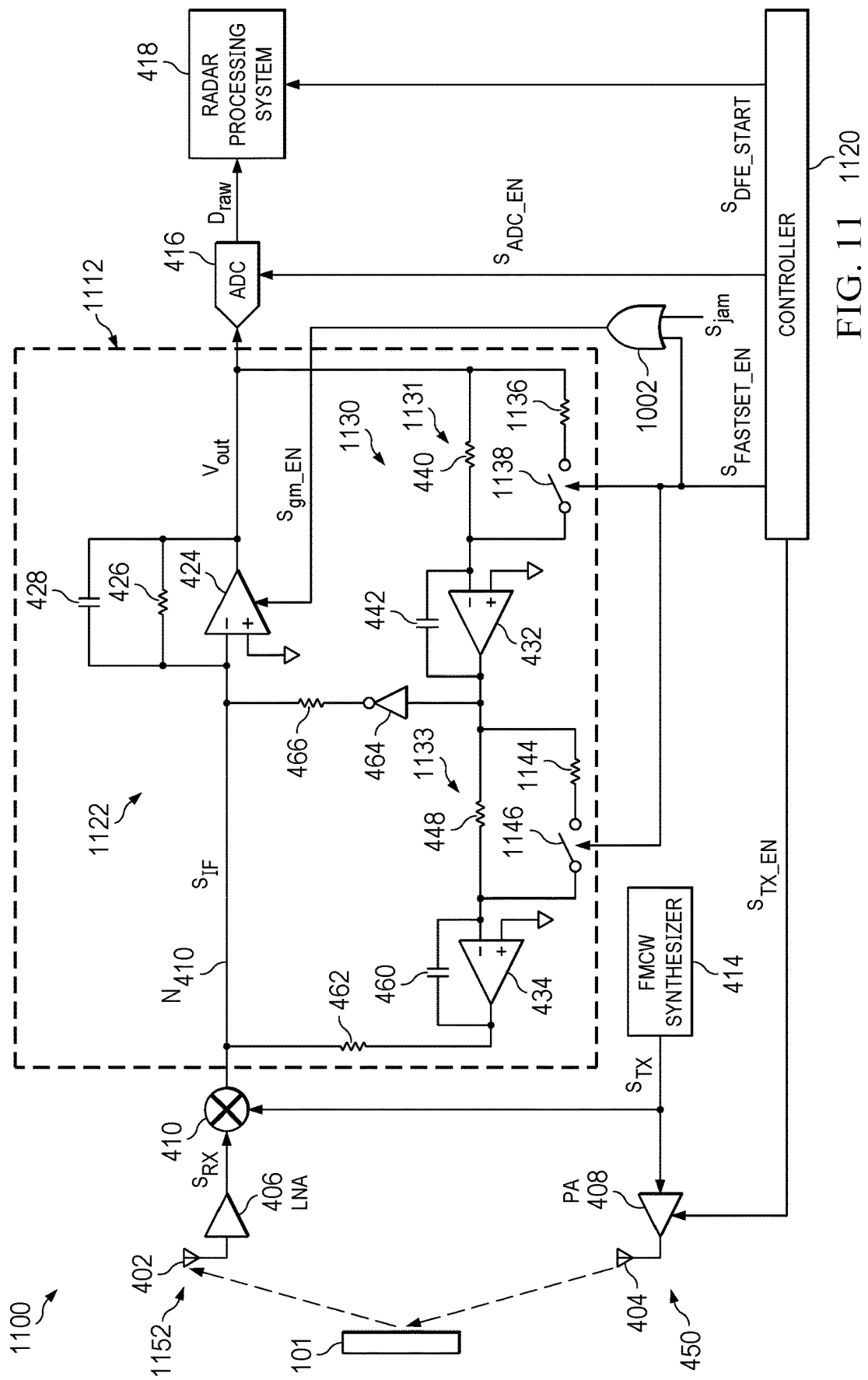
FIG. 11 shows a schematic diagram of a millimeter-wave radar system, according to an embodiment of the present invention.

FIG. 11 shows a schematic diagram of millimeter-wave radar system 1100, according to an embodiment of the present invention. Millimeter-wave radar system 1100 operates in a similar manner as millimeter-wave radar system 400. Millimeter-wave radar system 1100, however, includes OR gate 1002 for increasing the P1 dB of amplifier 424 at the beginning of each chirp (e.g., as illustrated in FIG. 9) and during a jamming event (as illustrated in FIG. 5). Millimeter-wave radar system 1100, also includes high-pass filters 1133 and 1131, which are capable of increasing their associated high-pass corner frequencies by closing (e.g., activating) switches 1146 and 1138, respectively, in response to the assertion of signal $S_{FASTSET\_EN}$.

In some embodiments, the OR function implemented by OR gate 1002 may be implemented by controller 1120. In addition, controller 1120 may be configured to assert and deassert the signals $S_{TX}$, $S_{FASTSET\_EN}$, $S_{ADC\_EN}$, and/or $S_{DFE\_START}$. The controller 1120 can deliver these signals to the circuits 408, 1112, 416, and 418 as shown in FIG. 11. As an example, controller 1120 may be configured to activate or deactivate switches 1138 and 1146 by controlling the signal $S_{FASTSET\_EN}$.

In a similar manner as described with respect to FIG. 11, millimeter-wave radar 800 may be modified so that the high-pass corner frequencies of high-pass filters 805 and 807 are increased in response to signal $S_{FASTSET\_EN}$ while the signal $S_{gm\_EN}$ provided to amplifier 802 is generated by performing the OR function between signals $S_{jam}$ and $S_{FASTSET\_EN}$ (e.g., using OR gate 1002).

Figure 12:
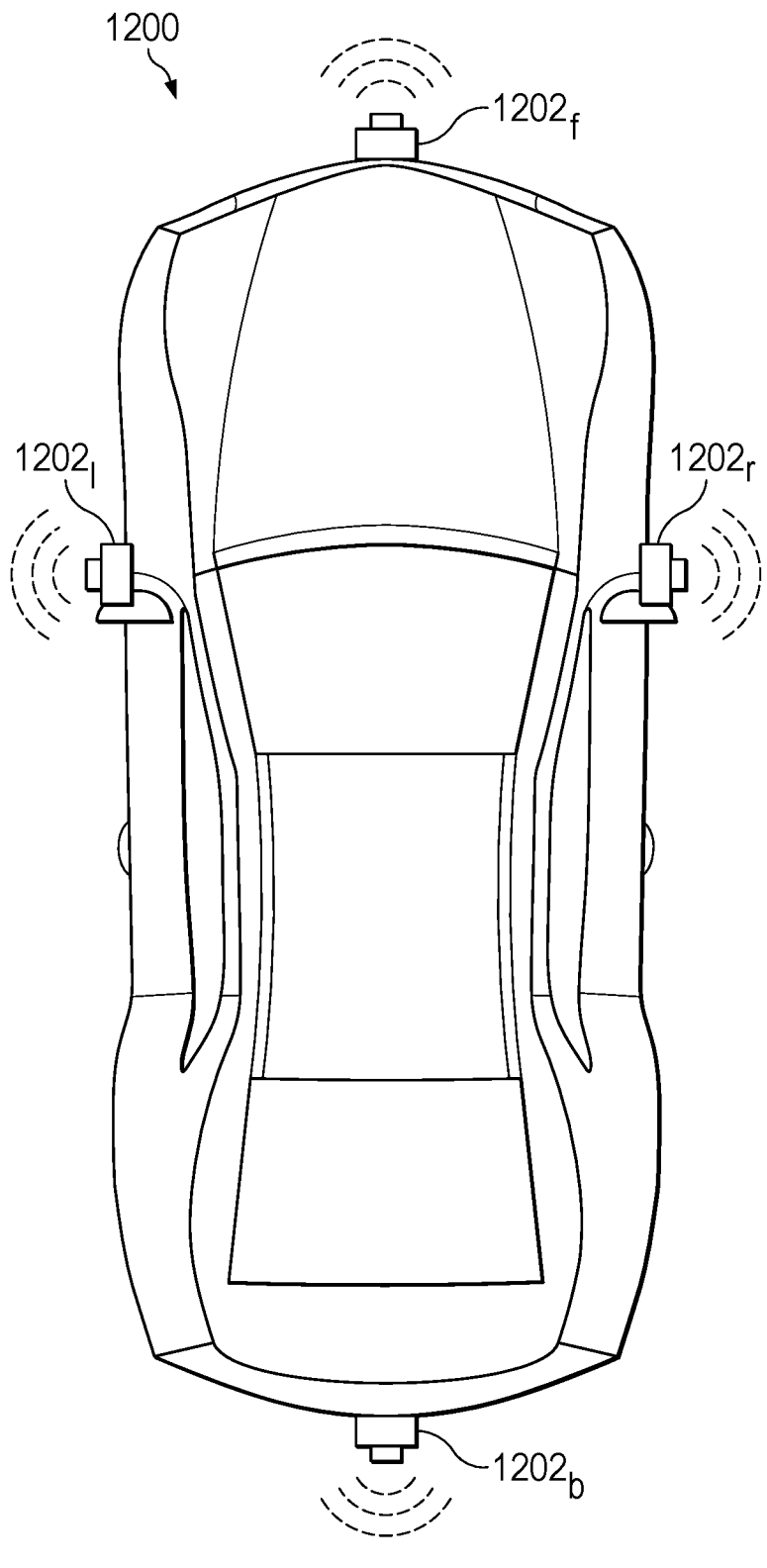
FIG. 12 illustrates an automotive vehicle, according to an embodiment of the present invention.

FIG. 12 illustrates automotive vehicle, according to an embodiment of the present invention. The vehicle includes one or more millimeter-wave radar system 1200 (which may be implemented, e.g., with radar systems 400, 800, or 1100). In some embodiments, radar system 1200, may be used to detect and track pedestrians, other vehicles, and/or other objects associated with driving in a road (e.g., sidewalks, street lights, etc.).

Figure 13:
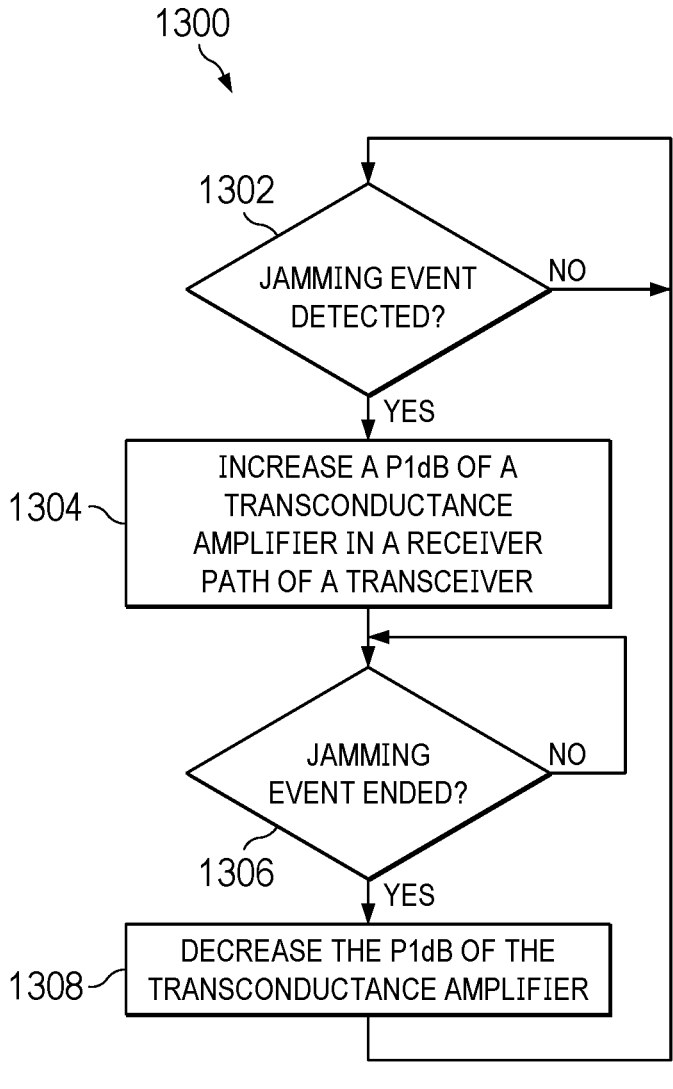
FIG. 13 illustrates a flow chart of an embodiment method for interference mitigation in a millimeter-wave radar system, according to an embodiment of the present invention.

FIG. 13 illustrates a flow chart of embodiment method 1300 for interference mitigation in a millimeter-wave radar system, according to an embodiment of the present invention. Method 1300 may be performed, e.g., by millimeter-wave radar systems 400, 1100, and 1202.

During step 1302, a controller (e.g., 420, 1120) determines whether a jamming event is detected. In some embodiments, the controller determines when a jamming event occurs when a jamming signal (e.g., $S_{jam}$) is asserted. In some embodiments, the controller determines that a jamming event occurred when on the output voltage $V_{out}$ of a transconductance amplifier (e.g., 424, 802) in a receiver path (e.g., 452, 1152) of a transceiver of a millimeter-wave radar system (e.g., 400, 1100, 1202) saturates. In some embodiments, the controller determines that a jamming event occurred when output (e.g., $D_{raw}$) of an ADC (e.g., 416) saturates. In some embodiments, the controller determines that a jamming event occurred when the total energy of the system (e.g., across all bins, e.g., based on an FFT of $D_{raw}$ performed by a radar processing system, such as 418) is higher than a predetermined threshold.

When a jamming event is detected (output "yes" during step 1302), the P1 dB of the transconductance amplifier is increased from a first value to a second value during step 1304. In some embodiments, the P1 dB of the transconductance amplifier is increased by increasing a bias current of the transconductance amplifier.

During step 1306, the controller determines whether the jamming event ended. In some embodiments, the controller determines when the jamming event ends when the jamming signal is deasserted. In some embodiments, the controller determines that the jamming event ended when the total energy of the system (e.g., across all bins, e.g., based on an FFT of $D_{raw}$ performed by a radar processing system, such as 418) is lower than a predetermined threshold.

When the jamming event ends (output "yes" during step 1306), the P1 dB of the transconductance amplifier is decreased, e.g., from the second value to the first value, during step 1308. In some embodiments, the P1 dB of the transconductance amplifier is decreased by decreasing the bias current of the transconductance amplifier.

FIG. 14 illustrates a flow chart of embodiment method 1400 for cross-coupling interference mitigation in a millimeter-wave radar system, according to an embodiment of the present invention. Method 1400 may be performed, e.g., by millimeter-wave radar systems 400, 1100, and 1202.

During step 1304, a P1 dB of a (e.g., 424, 802) in a receiver path (e.g., 452, 1152) of a transceiver of a millimeter-wave radar system (e.g., 400, 1100, 1202) is increased from a first value to a second value.

During step 1404, simultaneously or after performing step 1304, a transmitter path (e.g., 450) of the millimeter-wave radar system is enabled (e.g., by asserting signal $S_{TX\_EN}$). In some embodiments, enabling the transmitter path includes enabling a power amplifier (e.g., 408) of the transmitter path.

During step 1406, and after the transmitter path is enabled, a first signal (e.g., a chirp) is transmitted in the transmitter path, e.g., using the power amplifier and via an antenna (e.g., 404).

During step 1408, and during transmission of the first signal in the transmitter path, the corner frequency of the high-pass filter is decreased (e.g., from the second value to the first value).

FIG. 15 illustrates a flow chart of embodiment method 1500 for cross-coupling interference mitigation in a millimeter-wave radar system, according to an embodiment of the present invention. Method 1500 may be implemented, e.g., by millimeter-wave radar system 400, 1100 and 1202.

During step 1502, a corner frequency of a high-pass filter (e.g., 431, 433, 805, 807, 1131, 1133) of a first amplifier (e.g., 412, 800, 1112) in a receiver path (e.g., 452, 1152) of a transceiver of a millimeter-wave radar system (e.g., 400, 1100, 1202) is increased from a first value to a second value.

During step 1504, simultaneously or after performing step 1502, a transmitter path (e.g., 450) of the millimeter-wave radar system is enabled (e.g., by asserting signal $S_{TX\_EN}$). In some embodiments, enabling the transmitter path includes enabling a power amplifier (e.g., 408) of the transmitter path.

During step 1506, and after the transmitter path is enabled, a first signal (e.g., a chirp) is transmitted in the transmitter path, e.g., using the power amplifier and via an antenna (e.g., 404).

During step 1508, and during transmission of the first signal in the transmitter path, the corner frequency of the high-pass filter is decreased (e.g., from the second value to the first value).

Figure 16:
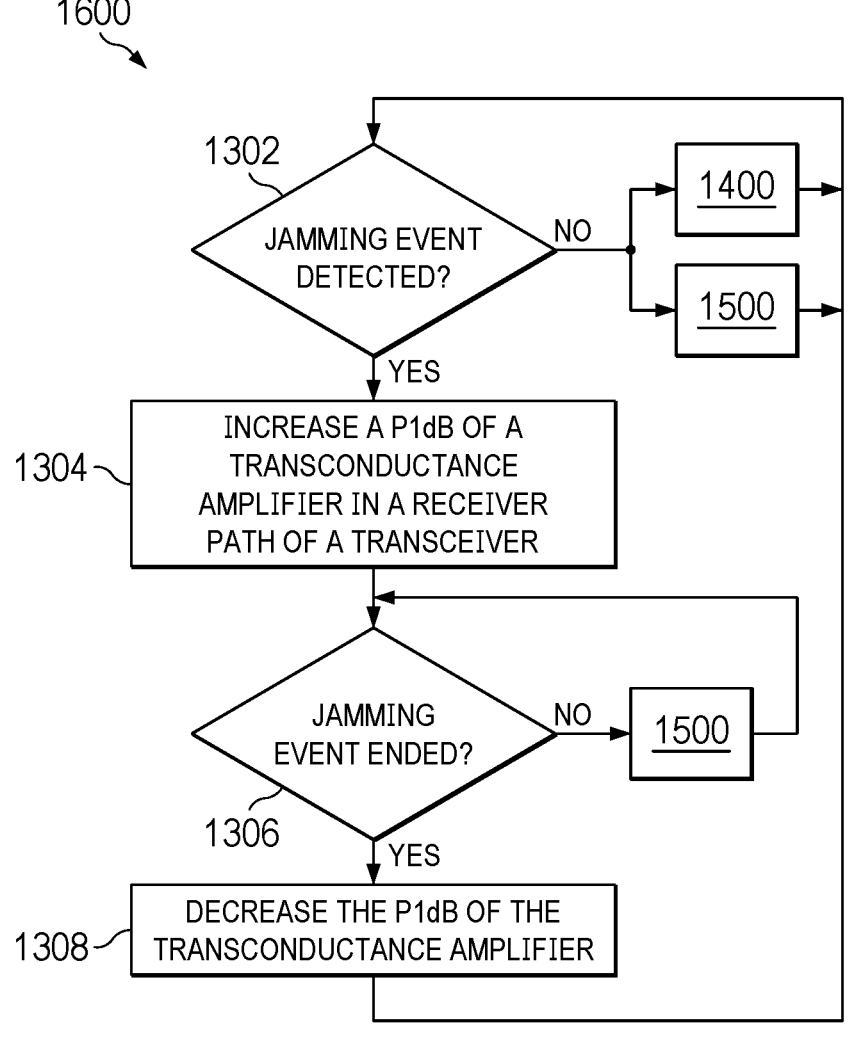
FIG. 16 illustrates a flow chart of an embodiment method for interference mitigation in a millimeter-wave radar system, according to an embodiment of the present invention.

In some embodiments, methods 1300, 1400, and 1500 may be combined. For example, FIG. 16 illustrate a flow chart of embodiment method 1600 for interference mitigation in a millimeter-wave radar system, according to an embodiment of the present invention. Method 1600, or portions thereof, may be performed, e.g., by millimeter-wave radar systems 400, 1100, and 1202.

As shown in FIG. 16, method 1600 may be performed in a similar manner as method 1300. In method 1600, however, when a jamming event is not detected (output "no" during step 1302), methods 1400 and/or 1500 may be performed. In some embodiments, in which both methods 1400 and 1500 are performed, steps 1304 and 1502 are performed simultaneously, steps 1404 and 1504 are performed simultaneously, steps 1406 and 1506 are the same step, and steps 1408 and 1508 are performed simultaneously.

As also shown in FIG. 16, in method 1600, during a jamming event (output "no" during step 1306), method 1500 may be performed periodically (e.g., for each chirp transmission).

Example embodiments of the present invention are summarized here. Other embodiments can also be understood from the entirety of the specification and the claims filed herein.

Example 1. A system including: an analog-to-digital converter (ADC); a receiver path including a transimpedance amplifier having an output coupled to the ADC; and a controller coupled to the receiver path and configured to, upon detection of a jamming event of the receiver path, cause an increase in a transconductance of the transimpedance amplifier from a first transconductance value to a second transconductance value.

Example 2. The system of example 1, where the controller is further configured to, upon detection of an end of the jamming event of the receiver path, cause a decrease in the transconductance of the transimpedance amplifier from the second transconductance value to the first transconductance value.

Example 3. The system of one of examples 1 or 2, where the controller is configured to detect the jamming event based on an output of the ADC.

Example 4. The system of one of examples 1 to 3, where the transimpedance amplifier includes a variable current source, and where the controller is configured to cause the increase in the transconductance of the transimpedance amplifier by causing an increase in a current generated by the variable current source.

Example 5. The system of one of examples 1 to 4, where the transimpedance amplifier is a single-ended transimpedance amplifier.

Example 6. The system of one of examples 1 to 5, where the transimpedance amplifier is a differential transimpedance amplifier.

Example 7. The system of one of examples 1 to 6, further including a transmitter path, where the controller is further coupled to the transmitter path, and where the controller is configured to: enable the transmitter path; and after enabling the transmitter path, cause a first signal to be transmitted via the transmitter path; and after the first signal is transmitted via the transmitter path, disable the transmitter path.

Example 8. The system of one of examples 1 to 7, where the controller is configured to: cause the increase in the transconductance of the transimpedance amplifier before transmission of the first signal; after disabling the transmitter path after the first signal is transmitted via the transmitter path, enable the transmitter path and cause transmission of a second signal via the transmitter path; and cause the transconductance of the transimpedance amplifier to remain at the second transconductance value during transmission of the first and second signals.

Example 9. The system of one of examples 1 to 8, where the controller is further configured to, after the jamming event has ended: cause an increase in the transconductance of the transimpedance amplifier from the first transconductance value to the second transconductance value; simultaneously or after causing the transconductance of the transimpedance amplifier to increase, enable the transmitter path; and after a second signal begins transmission in the enabled transmitter path, and during transmission of the second signal in the enabled transmitter path, cause the transconductance of the transimpedance amplifier to decrease from the second transconductance value to the first transconductance value.

Example 10. The system of one of examples 1 to 9, further including a first high-pass filter coupled to the transimpedance amplifier, where the controller is further configured to: cause a corner frequency of the first high-pass filter to increase from a first corner frequency value to a second corner frequency value; simultaneously or after causing the corner frequency of the first high-pass filter to increase, enable the transmitter path; and after the first signal begins transmission in the enabled transmitter path, and during transmission of the first signal in the enabled transmitter path, cause the corner frequency of the first high-pass filter to decrease from the second corner frequency value to the first corner frequency value.

Example 11. The system of one of examples 1 to 10, where the transmitter path includes a power amplifier, where enabling the transmitter path includes enabling the power amplifier, and where disabling the transmitter path includes disabling the power amplifier.

Example 12. The system of one of examples 1 to 11, where the transmitter path further includes a frequency-modulated continuous wave (FMCW) synthesizer configured to generate the first signal.

Example 13. The system of one of examples 1 to 12, where the system is a millimeter-wave radar system, where the first signal is a chirp, and where an output of the FMCW synthesizer is coupled to an input of the transimpedance amplifier via a mixer.

Example 14. The system of one of examples 1 to 13, where the system is an automotive vehicle.

Example 15. The system of one of examples 1 to 14, where the vehicle includes a plurality of millimeter-wave radar systems, and where the receiver path is part of a millimeter-wave radar system of the plurality of millimeter-wave radar systems.

Example 16. The system of one of examples 1 to 15, where the system is a wireless communication system.

Example 17. A system including: an analog-to-digital converter (ADC); a transmitter path; a receiver path including a transimpedance amplifier having an output coupled to the ADC; and a controller coupled to the transmitter path and to the receiver path, where the controller is configured to: cause an increase in a transconductance of the transimpedance amplifier from a first transconductance value to a second transconductance value, simultaneously or after causing the transconductance of the transimpedance amplifier to increase, cause the transmitter path to be enabled, and after a first signal begins transmission in the enabled transmitter path, and during transmission of the first signal in the enabled transmitter path, cause the transconductance of the transimpedance amplifier to decrease from the second transconductance value to the first transconductance value.

Example 18. The system of example 17, further including a high-pass filter coupled to the transimpedance amplifier, where the controller is further configured to: cause a corner frequency of the high-pass filter to increase from a first corner frequency value to a second corner frequency value when the transconductance of the transimpedance amplifier increases from the first transconductance value to the second transconductance value; and cause the corner frequency of the high-pass filter to decrease from the second corner frequency value to the first corner frequency value when the transconductance of the transimpedance amplifier decreases from the second transconductance value to the first transconductance value.

Example 19. The system of one of examples 17 or 18, where the controller is further configured to, upon detection of a jamming event of the receiver path, cause an increase in the transconductance of the transimpedance amplifier from the first transconductance value to the second transconductance value.

Example 20. The system of one of examples 17 to 19, where the controller is configured to detect the jamming event based on an output of the ADC.

While this invention has been described with reference to illustrative embodiments, this description is not limiting. Various modifications and combinations of the illustrative embodiments, as well as other embodiments of the invention, will be apparent to persons skilled in the art upon reference to the description. The appended claims encompass any such modifications or embodiments.

What is claimed is:

1. A system comprising:
an analog-to-digital converter (ADC);
transmission circuitry;
a receiver path comprising a transimpedance amplifier having an output coupled to the ADC; and
a controller coupled to the transmission circuitry and to receiver path and configured to, upon detection of a jamming event of the receiver path, cause an increase in a transconductance of the transimpedance amplifier from a first transconductance value to a second transconductance value, wherein the controller is further configured to cause the increase in transconductance before causing the transmission circuitry to transmit a first signal, cause the transmission circuitry to transmit the first signal while the transimpedance amplifier remains at the second transconductance value, disable the transmission circuitry after causing transmission of the first signal, enable the transmission circuitry and cause the transmission circuitry to transmit a second signal with the transimpedance amplifier at the second transconductance value.

2. The system of claim 1, wherein the controller is further configured to, upon detection of an end of the jamming event of the receiver path, cause a decrease in the transconductance of the transimpedance amplifier from the second transconductance value to the first transconductance value.

3. The system of claim 1, wherein the controller is configured to detect the jamming event based on an output of the ADC.

4. The system of claim 1, wherein the transimpedance amplifier comprises a variable current source, and wherein the controller is configured to cause the increase in the transconductance of the transimpedance amplifier by causing an increase in a current generated by the variable current source.

5. The system of claim 1, wherein the transimpedance amplifier is a single-ended transimpedance amplifier.

6. The system of claim 1, wherein the transimpedance amplifier is a differential transimpedance amplifier.

7. The system of claim 1, further comprising a transmitter path that includes the transmission circuitry, wherein the controller is further coupled to the transmitter path, and wherein the controller is configured to:
enable the transmitter path; and
after enabling the transmitter path, cause the first signal to be transmitted via the transmitter path; and
after the first signal is transmitted via the transmitter path, disable the transmitter path.

8. The system of claim 7, wherein the controller is configured to:

after disabling the transmitter path after the first signal is transmitted via the transmitter path, enable the transmitter path and cause transmission of the second signal via the transmitter path.

9. The system of claim 8, wherein the controller is further configured to, after the jamming event has ended:

cause an increase in the transconductance of the transimpedance amplifier from the first transconductance value to the second transconductance value;

simultaneously or after causing the transconductance of the transimpedance amplifier to increase, enable the transmitter path; and after a second signal begins transmission in the enabled transmitter path, and during transmission of the second signal in the enabled transmitter path, cause the transconductance of the transimpedance amplifier to decrease from the second transconductance value to the first transconductance value.

10. The system of claim 7, further comprising a first high-pass filter coupled to the transimpedance amplifier, wherein the controller is further configured to:

cause a corner frequency of the first high-pass filter to increase from a first corner frequency value to a second corner frequency value;

simultaneously or after causing the corner frequency of the first high-pass filter to increase, enable the transmitter path; and after the first signal begins transmission in the enabled transmitter path, and during transmission of the first signal in the enabled transmitter path, cause the corner frequency of the first high-pass filter to decrease from the second corner frequency value to the first corner frequency value.

11. The system of claim 7, wherein the transmitter path comprises a power amplifier, wherein enabling the transmitter path comprises enabling the power amplifier, and wherein disabling the transmitter path comprises disabling the power amplifier.

12. The system of claim 11, wherein the transmitter path further comprises a frequency-modulated continuous wave (FMCW) synthesizer configured to generate the first signal.

13. The system of claim 12, wherein the system is a millimeter-wave radar system, wherein the first signal is a chirp, and wherein an output of the FMCW synthesizer is coupled to an input of the transimpedance amplifier via a mixer.

14. The system of claim 1, wherein the system is an automotive vehicle.

15. The system of claim 14, wherein the vehicle comprises a plurality of millimeter-wave radar systems, and wherein the receiver path is part of a millimeter-wave radar system of the plurality of millimeter-wave radar systems.

16. The system of claim 1, wherein the system is a wireless communication system.

17. A system comprising:

an analog-to-digital converter (ADC);

a transmitter path;

a receiver path comprising a transimpedance amplifier having an output coupled to the ADC; and a controller coupled to the transmitter path and to the receiver path, wherein the controller is configured to:

cause an increase in a transconductance of the transimpedance amplifier from a first transconductance value to a second transconductance value, simultaneously or after causing the transconductance of the transimpedance amplifier to increase, cause the transmitter path to be enabled, and after a first signal begins transmission in the enabled transmitter path, and during transmission of the first signal in the enabled transmitter path, cause the transconductance of the transimpedance amplifier to decrease from the second transconductance value to the first transconductance value.

18. The system of claim 17, further comprising a high-pass filter coupled to the transimpedance amplifier, wherein the controller is further configured to:

cause a corner frequency of the high-pass filter to increase from a first corner frequency value to a second corner frequency value when the transconductance of the transimpedance amplifier increases from the first transconductance value to the second transconductance value; and cause the corner frequency of the high-pass filter to decrease from the second corner frequency value to the first corner frequency value when the transconductance of the transimpedance amplifier decreases from the second transconductance value to the first transconductance value.

19. The system of claim 17, wherein the controller is further configured to, upon detection of a jamming event of the receiver path, cause an increase in the transconductance of the transimpedance amplifier from the first transconductance value to the second transconductance value.

20. The system of claim 19, wherein the controller is configured to detect the jamming event based on an output of the ADC.

* * * * *